US008619457B2

(12) United States Patent
Lee

(10) Patent No.: US 8,619,457 B2
(45) Date of Patent: Dec. 31, 2013

(54) THREE-DEVICE NON-VOLATILE MEMORY CELL

(75) Inventor: Tsung-Wen Lee, Milpitas, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 331 days.

(21) Appl. No.: 12/880,871

(22) Filed: Sep. 13, 2010

(65) Prior Publication Data

US 2012/0063192 A1 Mar. 15, 2012

(51) Int. Cl.
*G11C 11/00* (2006.01)

(52) U.S. Cl.
USPC .. 365/148; 365/100; 365/189.15; 365/189.16

(58) Field of Classification Search
USPC ............ 365/148, 171, 145, 149, 154, 189.01, 365/163, 189.14, 63, 189.05, 194, 189.16, 365/156, 230.05, 203, 100, 189.15
See application file for complete search history.

(56) References Cited

U.S. PATENT DOCUMENTS

| | | | | |
|---|---|---|---|---|
| 6,906,939 | B2 * | 6/2005 | Rinerson et al. | 365/63 |
| 7,038,935 | B2 * | 5/2006 | Rinerson et al. | 365/148 |
| 7,054,183 | B2 * | 5/2006 | Rinerson et al. | 365/148 |
| 7,381,616 | B2 | 6/2008 | Hsu | |
| 7,718,988 | B2 * | 5/2010 | Lee | 257/2 |
| 7,719,866 | B2 * | 5/2010 | Boldo | 363/89 |
| 8,488,364 | B2 * | 7/2013 | Chung | 365/148 |
| 2005/0052926 | A1 * | 3/2005 | Agata et al. | 365/222 |
| 2005/0110117 | A1 | 5/2005 | Hsu | |
| 2006/0050546 | A1 | 3/2006 | Roehr | |
| 2009/0073741 | A1 | 3/2009 | Liu | |
| 2009/0086527 | A1 * | 4/2009 | Lee et al. | 365/100 |

FOREIGN PATENT DOCUMENTS

| | | |
|---|---|---|
| WO | 2010068221 A1 | 6/2010 |
| WO | 2010087854 A1 | 8/2010 |

OTHER PUBLICATIONS

Mika Laiho, et al.; "Cellular Nanoscale Network Cell with Memristors for Local Implication Logic and Synapses"; Circuits and Systems (ISCAS); Proceedings of 2010 IEEE International Symposium; May 30, 2010; Turku, Finland.
Eike Linn, et al.; "Complementary resistive switches for passive nanocrossbar memories"; Nature Materials 9; Apr. 18, 2010; pp. 403-406.

* cited by examiner

*Primary Examiner* — Pho M Luu

(57) ABSTRACT

A three-device non-volatile memory cell includes a first resistive device, a second resistive device connected to the first resistive device in a mutual complementary manner, and a third resistive device connected to both said first resistive device and said second resistive device in a mutual complementary manner. A memory array includes a set of read lines intersecting a set of bit lines, a set of program lines intersecting said bit lines, memory cells disposed at intersections between the intersecting set of bit lines. Each of the memory cells includes a program resistive device connected to one of the program lines, a read resistive device connected to one of the read lines, and a bit resistive device connected to one of the bit lines and connected to the program device and the read device in a mutual complementary manner.

19 Claims, 9 Drawing Sheets

Table (600)

| | Pulse Voltage at Selected Line | | | Expected results | | |
|---|---|---|---|---|---|---|
| | Pgm line | Bit line | Read line | Pgm dev. | Bit dev. | Read dev. |
| Virgin state (602) | | | | Off (virgin) | Off (virgin) | Off (virgin) |
| Initialization (604) | 0 | - V/2 | + V/2 | Off (virgin) | On | Off |
| Reset (606) | - V/2 | + V/2 | 0 | On | Off | Off |
| Program "1" (608) | + V/2 | - V/2 | 0 | Off | On | Off |
| Program "0" (610) | - V/2 | + V/2 | 0 | On | Off | Off |
| Read (612) | 0 | Sense Amplifier | Vread | unchange | unchange | unchange |

THREE-DEVICE NON-VOLATILE MEMORY CELL

BACKGROUND

As the use of digital data increases, the demand for faster, smaller, and more efficient memory structures increases. One type of memory structure that has recently been developed is a single memristor crossbar memory array. A crossbar memory array includes a first set of conductive lines which perpendicularly intersect a second set of conductive lines. A programmable memory cell configured to store digital data is placed at each intersection of the lines.

One type of device which can be used as a memory cell is a resistive switch such as a memristor. Using memristive devices as resistive devices on a crossbar array brings up several design constraints. For example, when applying read/write voltages to a selected memory cell, care must be taken to prevent excessive leakage current from passing through unselected memory cells. Additionally, during read operations, leakage current through unselected cells can affect the measurements taken by a sense amplifier. Thus, the number of memory cells along a particular wire which are in a low resistive state may have to be limited.

One way to reduce the leakage current is to use two memristive devices in series at each intersection of lines in a memory array. These two memristive devices can be placed in a complementary manner. If two memristors are connected in a complementary manner, then one memristor is in a high resistive (OFF) state while the other memristor is in a low resistive (ON) state. The combined resistance will always be in a high resistive state. This reduces the leakage current within the memory array. If the memristor which is initially in an OFF state is switched to an ON state, then the other memristor will be switched from an ON state to an OFF state. One of the two memristive devices placed in this complementary manner can be used to represent digital data. For example, an ON state may represent a digital '1' and an OFF state may represent a digital '0'.

When memristive devices are placed in a complementary manner as described above, they can exhibit a property that results in a destructive read. When reading the state of a memory cell with a destructive read, the state of the memory cell is lost during the read process. The original state must then be written back to the memory cell after the read operation is completed. This takes additional time and power, thus reducing the speed and power efficiency at which the memory array is able to operate.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIG. 6 is a table summarizing illustrative operations for a three-device memory cell, according to one example of principles described herein.

Throughout the drawings, identical reference numbers designate similar, but not necessarily identical, elements.

DETAILED DESCRIPTION

Figure 1A:
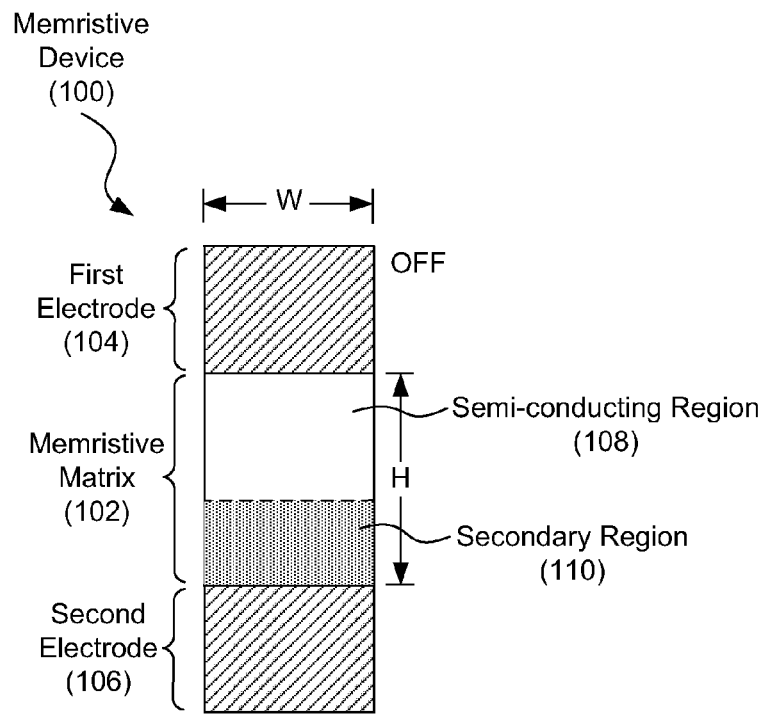
FIG. 1A is diagram showing an illustrative memristive device with no electrical conditions being applied, according to one example of principles described herein.

As mentioned above, one way to reduce the leakage current is to use two memristive devices at each intersection of wire lines in a memory array. These two memristive devices can be placed in a complementary manner. If two memristors are connected in a complementary manner, one memristor is in a high resistive (OFF) state while the other memristor is in a low resistive (ON) state. If the memristor which is initially in an OFF state is switched to an ON state, then the other memristor will be switched from an ON state to an OFF state. One of the two memristive devices placed in this complementary manner can be used to represent digital data. For example, an ON state may represent a digital '1' and an OFF state may represent a digital '0'.

When memristive devices are placed in a complementary manner as described above, they can exhibit a property that results in a destructive read. When reading the state of a memory cell in a destructive read, the state of the memory cell is lost during the read process. The original state must then be written back to the memory cell after the read operation is completed. This takes additional time and power, thus reducing the speed and power efficiency at which the memory array is able to operate.

In light of this and other issues, the present specification discloses a three-device memory cell. This three device memory reduces leakage current to the unselected memory cells as well as provides a memory cell that does not require a destructive read. Throughout this specification, the three-device memory cell will be described as using memristive devices as the switching devices. However, other resistive switching devices may be used as well.

According to one illustrative example, the three memristors are arranged so that one terminal of each memristor is connected to a common floating node which will be referred to as a center conductor. Each memristive device is connected to the center conductor so that it is in a mutual complementary relation to the other two memristors. The first memristor will be referred to as the bit memristor. The second and third memristors will be referred to as the program memristor and the read memristor respectively. These three memristors and the center conductor form a single memory cell.

The bit memristor is connected to the program memristor in a complementary manner. The bit memristor and program memristor pair can be used to store a single digital bit. The bit memristor and the program memristor will be switched based on what digital value is being stored in the memory cell. The read memristor is used to probe the state of the bit memristor and program memristor pair without destroying the data stored in that pair. As will be described in more detail below, the state of the three-device memory cell can be changed by applying voltage pulses across a complementary pair within the memory cell. If one memristor of the pair is switched from high resistive state (OFF) to low resistive state (ON) then the other memristor will be switched from low resistive state (ON) to high resistive state (OFF) simultaneously. The various memory cell operations can be done by flipping complementary pairs within the three-device memory cell.

As mentioned above, the three-device memory cell reduces programming leakage current. This allows more memory cells to be placed within a particular block of memory. Additionally, the three-device memory cell does not have a destructive read. Therefore, an additional write back operation is not needed after each read operation. This increases the speed at which the memory cell is able to perform read operations. Furthermore, a lower read voltage can be used, which reduces the power consumption of the memory array.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Referring now to the figures, FIG. 1A is diagram showing an illustrative memristive device with no electrical conditions being applied. According to one illustrative example, the memristive device includes a first electrode (104) and a second electrode (106) in electrical and physical contact with a memristive matrix (102). The memristive matrix (102) is initially comprised of two separate regions: a semiconducting region (108) which is intentionally un-doped and a highly doped secondary region (110).

Throughout the specification and appended claims, the term "memristive matrix" describes a thin film of material that is electronically semiconducting or nominally electronically insulating and also a weakly ionic conductor. The memristive matrix (102) is capable of transporting and hosting ions that act as dopants to control the flow of electrons through the memristive device (100). The basic mode of operation is to apply an electrical field (the drift field, which may exceed a threshold for enabling the motion of the ions in the memristive matrix) across the memristive device (100). The electrical field is large enough to cause an ionic species to be transported within the memristive matrix (102) via ionic transport. The ionic species are specifically chosen from those that act as electrical dopants for the memristive matrix (102), and thereby change the electrical conductivity of the matrix from a high resistive state to a low resistive state. Furthermore, the memristive matrix (102) and the dopant species are chosen such that the drift of the dopants within the memristive matrix (102) is possible but not too facile. This ensures that the memristive device remains in whatever state it is set for a reasonably long time, perhaps many years at room temperature. Thus, the memristive device (100) is nonvolatile. A nonvolatile device is one which holds its state with or without receiving power.

The memristive matrix material (102) may be a thin film (generally less than 100 nm thick), and is in many cases nanocrystalline or amorphous. The mobility of the dopant species in such nanostructured materials is much higher than in a bulk crystalline material, since diffusion can occur through grain boundaries, pores, or through local structural imperfections in an amorphous material. Also, because the film is so thin, the amount of time required to drift enough dopants into or out of a local region of the film to substantially change its conductivity is relatively rapid. Another advantage of nanometer scale memristive devices is that a large electrical field can be produced by a relatively small applied voltage.

Conduction of electrons through the matrix material (102) is frequently dominated by thermionic emission and quantum mechanical tunneling of the electrons. When a semiconducting matrix material is essentially intrinsic at a junction with an electrode, the tunneling barrier is high and wide, causing the memristive device to be in a high resistive state. When a significant number of charged dopant species have been injected into or distributed throughout the semiconductor, the width and perhaps the height of the tunneling barrier are diminished by the potential of the charged dopant species. This results in an increase of the conductivity of the switch, placing the memristive device (100) in a low resistive state.

FIG. 1A illustrates one potential "as manufactured" state of the memristive device (100). The semiconducting region (108) has very few dopants and prevents electrical current from flowing between the two electrodes (104, 106). The secondary region (110) is conductive and serves as a source of dopants which can be moved into the semiconducting region (108) to change the overall electrical conductivity of the memristive matrix (102). Consequently, in the "as manufactured" state of the memristive device illustrated in FIG. 1A, the memristive device (100) is a high resistive state.

The electrodes (104, 106) may be constructed from a variety of conducting materials, including but not limited to: metals, metal alloys, metal composite materials, nanostructured metal materials, or other suitable conducting materials.

The memristive matrix (102) has a height of "H" and a width of "W" as shown in FIG. 1A. For purposes of illustration only, assume that the height "H" is 100 nanometers and the width "W" is approximately 50 nanometers. As discussed above, a relatively intense electrical field can be generated across the thin film of memristive matrix by a relatively small voltage. For example, a dopant may require an electrical field intensity of 100,000 volts per centimeter to move within the matrix. If the distance between two electrodes is 100 nanometers, a voltage bias of only 1 Volt applied across the first electrode (104) and the second electrode (106) will produce the required electrical field intensity of 100,000 volts/centimeter through the memristive material (102). The application of a programming voltage above a certain threshold allows the dopants to be moved through the memristive matrix (102).

Figure 1B:
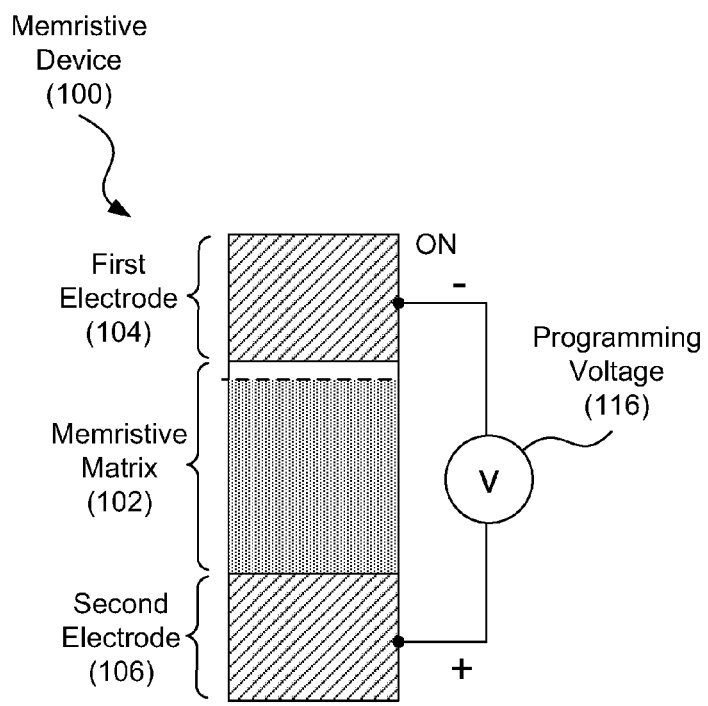
FIG. 1B is a diagram showing the memristive device with a programming voltage applied, according to one example of principles described herein.

FIG. 1B is a diagram showing the memristive device (100) with a programming voltage (116) applied. The programming voltage (116) results in an electrical field which facilitates not only the movement of dopants from the highly doped region (110) into the intrinsic region (108) but also the creation of some positive dopants, such as oxygen vacancies, via an electro-reduction process in oxide memristive materials. The polarity and voltage difference which is applied across the memristive matrix (102) varies according to a variety of factors including, but not limited to: material properties, geometry, dopant species, temperature, and other factors. When the ions are positively charged, the ions are repelled by positive electrode and attracted to negative electrode. For example, a positive voltage may be applied to the second electrode (106) and negative voltage may be applied to the first electrode (104) so that the oxygen vacancies are attracted toward the first electrode. This increases the conductivity of the intrinsic region (108) placing the memristive device (100) in a low resistive state. Conversely a negative voltage to the second electrode and a positive voltage to the first electrode will repel oxygen vacancies away from the first electrode. This decreases the conductivity of the intrinsic region (108) placing the memristive device (100) in a high resistive state.

According to one illustrative example, the initial application of a programming voltage (116) to the memristive device (100) is used to form the junction and define its switching characteristics. This initial programming voltage (116) may be higher than other applied voltages used for operational purposes. The initial programming voltage (116) may serve a number of functions which prepare the junction for further use. For example, the programming voltage (116) may result in the initial creation of additional mobile dopants or the migration of the mobile dopants into more active regions of the memristive matrix (102), which reduces the effective thickness of the switching layer and causes an increased electric field with the same applied voltage. In practice the voltage creates local filamentary channels in the memristive matrix (102) that facilitate the creation and migration of the dopants. In addition, the electric field for dopant drift in the switching process is usually lower than that for dopant creation in the electroforming process. Consequently, lower programming voltages (116) can be subsequently used to move the dopants after electroforming.

Figure 2A:
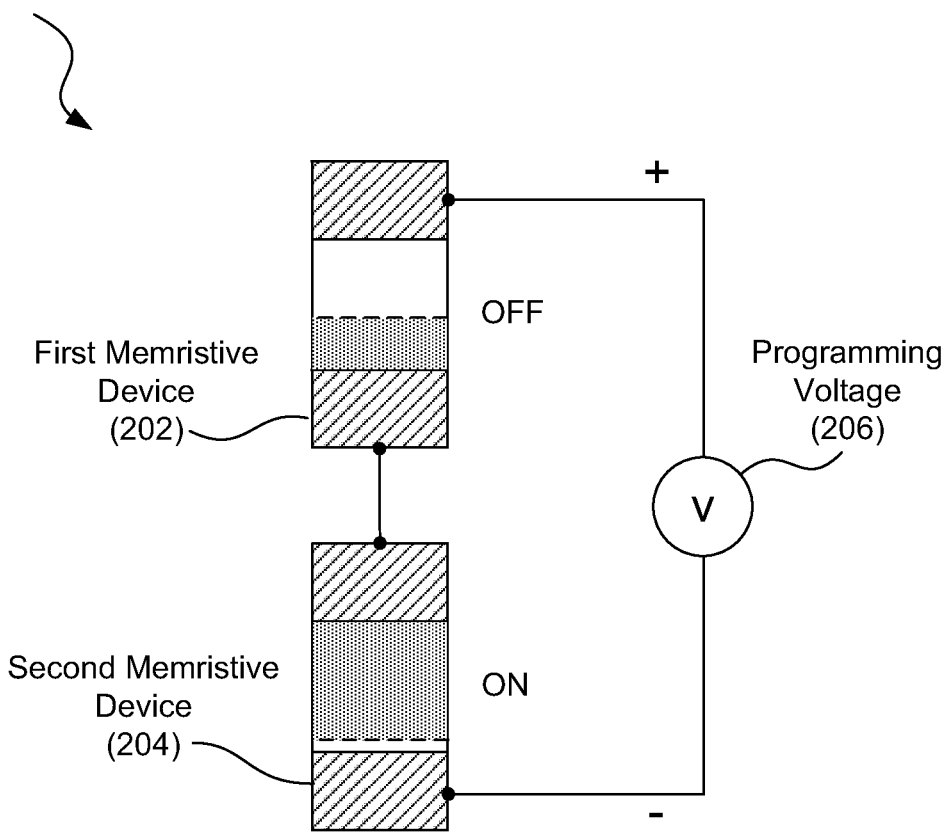
FIG. 2A is a diagram showing two memristive devices connected in a complementary manner with a programming voltage applied, according to one example of principles described herein.

FIG. 2A is a diagram showing an illustrative complementary two-device memory cell (200). The two device memory cell (200) includes two memristive devices (202, 204) connected in series. The two memristive devices are connected such that the terminals adjacent to the highly doped region of the devices are connected. A programming voltage (206) is applied across the two memristive devices (202, 204) to set the state of the memristive devices (202, 204). The polarity of programming voltage results in an electrical field which enhances dopant migration toward the first electrode of one memristor and away from the first electrode of the other memristor. This dopant migration switches the state of the memristive devices in a complementary manner.

For example, with the positive terminal of the programming voltage (206) applied to the first memristive device (202), the first memristive device (202) will be set to an OFF state and the second memristive device (204) will be set to an ON state. When the polarity of programming voltage is reversed, the second memristive device (204) will be set to an OFF state and the first memristive device (202) will be set to an ON state simultaneously. Therefore, the combined device is always in the high resistive state. When the complementary device is used as a memory cell, the combined high resistance under the application of a programming voltage avoids programming leakage for the unselected memory cells despite the data being stored in the memory cells.

The state of the memristive devices (202, 204) can be used to represent digital data. For example, a digital '1' can be represented by the first memristive device (202) being in an ON state and the second memristive device (204) being in an OFF state. A digital '0' can be represented by the first memristive device (202) being in an OFF state and the second memristive device (204) being in an ON state.

Figure 2B:
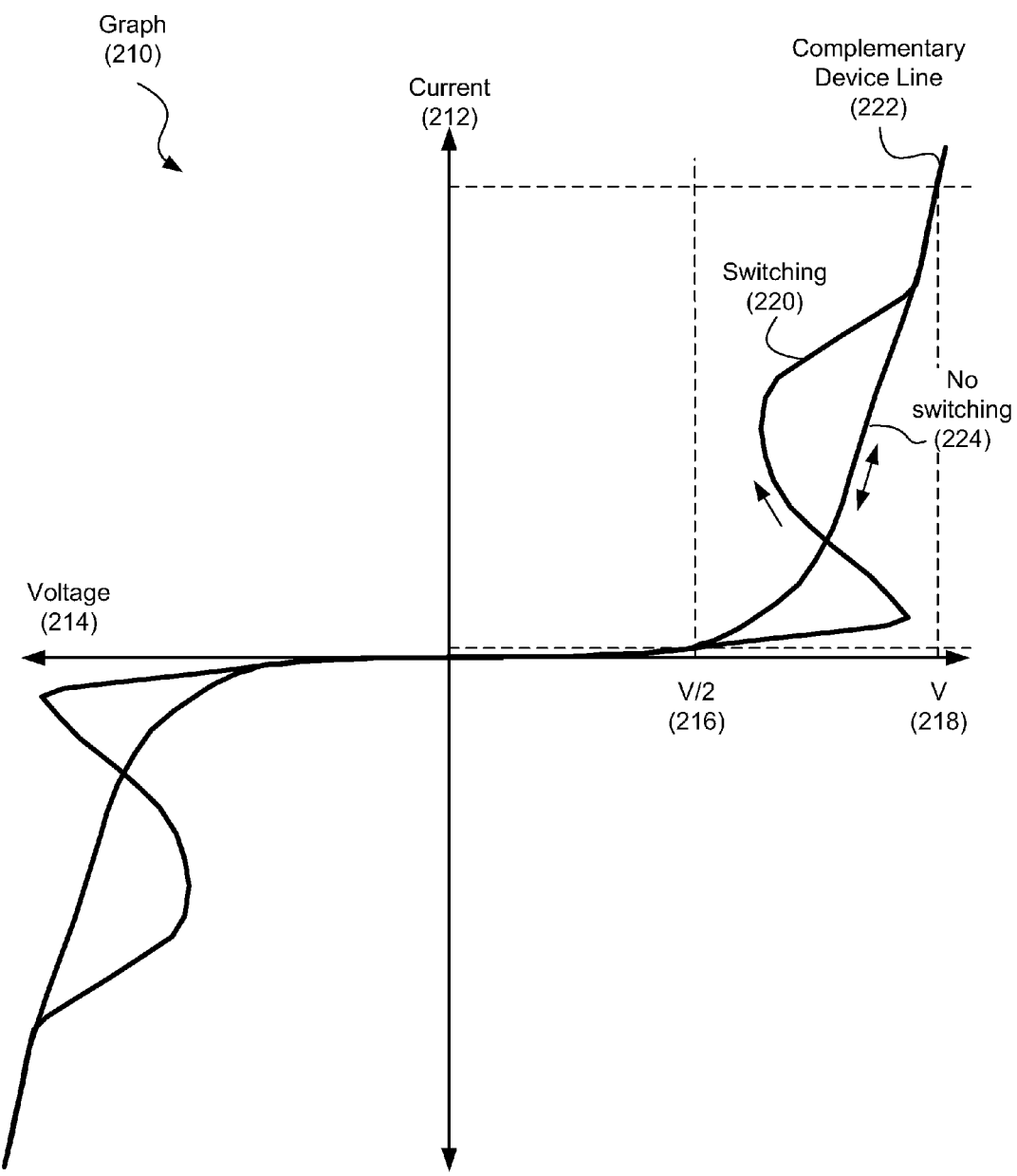
FIG. 2B is a graph showing an illustrative voltage to current relation of a non-linear and hysteretic complementary memristive devices of FIG. 2A, according to one example of principles described herein.

FIG. 2B is a graph (210) showing an illustrative current to voltage relationship of a complementary two-device memory cell (200). The horizontal axis of the graph represents voltage (214) and the vertical axis of the graph represents electric current (212). The non-linear and hysteretic device line (222) indicates the electric current passing through the complementary device along an upward voltage sweep and then along a downward voltage sweep.

Along the upward voltage sweep as the programming voltage (206) increases, the second memristive device (204) is turned ON and then the first memristive device (202) is turned OFF. This corresponds to the switching (220) region of the device line (222). The higher currents above the switching region (220) correspond to the forward current of a Schottky-like diode. This Schottky-like diode is located at the interface between the semiconducting region and the adjacent electrode of the memristive device in the OFF state. In this case, this would be the first memristive device (202).

Along the downward voltage sweep after the switching has occurred, the current decreases with decreasing voltage. This corresponds to the no-switching region (224) of the device line (222). This corresponds to the forward bias characteristics of the Schottky-like diode. Subsequent voltage sweeps of the same polarity will follow the no-switching region (224) of the device line (222). This indicates that the first memristive device (202) will stay OFF and the second memristive device (204) will stay ON. When the programming voltage (206) reverses its polarity, the same switching events take place and the non-linear and hysteretic lines repeats in the reverse polarity. Therefore, the voltage to current relation is symmetric with respect to the bias polarity.

When programming a complementary two-device cell (200), the voltage pulse V (218) must be higher than the voltage region where the switching events occur. If the initial state of the memory cell (200) is different from the final state of the memory cell (200), then the current follows the switching region (220) of the device line (222). If the initial state of the memory cell (200) is the same as the final state of the memory cell (200), then the current follows the no switching portion (224) of the device line (222).

Applying half of a programming voltage, V/2 (216), across a complementary memory cell (200) will not change the state of the memristive devices (202, 204). This voltage is usually referred to as half-select voltage or inhibition voltage. In a crossbar memory array, a half-select voltage is applied to the selected row and another half-select voltage of opposite polarity is applied to the selected column. This ensures that only the target memory cell will be switched by a bias of full programming voltage, V (218). The remaining unselected cells on the selected row and the unselected cells on the selected column see only half the programming voltage, V/2 (216). Thus, the state of the unselected memory cells will remain unchanged.

To determine the state of a two-device memory cell (200), a positive voltage pulse (206) of magnitude V (218) is applied across the memory cell (200). If the memory cell (200) is initially representing a digital '1', then it will be switched to represent a digital '0'. If the memory cell (200) is initially representing a digital '0', then it will remain in that state. Sensing circuitry can then be used to measure the current response waveform that results from application of the programming voltage. This current response waveform can then be used to determine if there was a change in the state of the memory cell. If there is indeed a change in the state of the memory cell, then it can be determined that the memory cell was representing a digital '1'. If there is no change in the state of the memory cell, it can be determined that the memory cell was storing a digital '0'. Once the original state of the memory cell has been determined and has changed its state during the reading operation, then the original state is written back. This destructive read slows down the speed at which a memory array using this type of memory cell is able to operate. Additionally, the destructive read unnecessarily consumes more power.

In light of this issue, the present specification discloses use of a complementary three-device memory cell. The third switching element within the three-device memory cell allows a memristive memory cell without a destructive read to be realized.

Figure 3A:
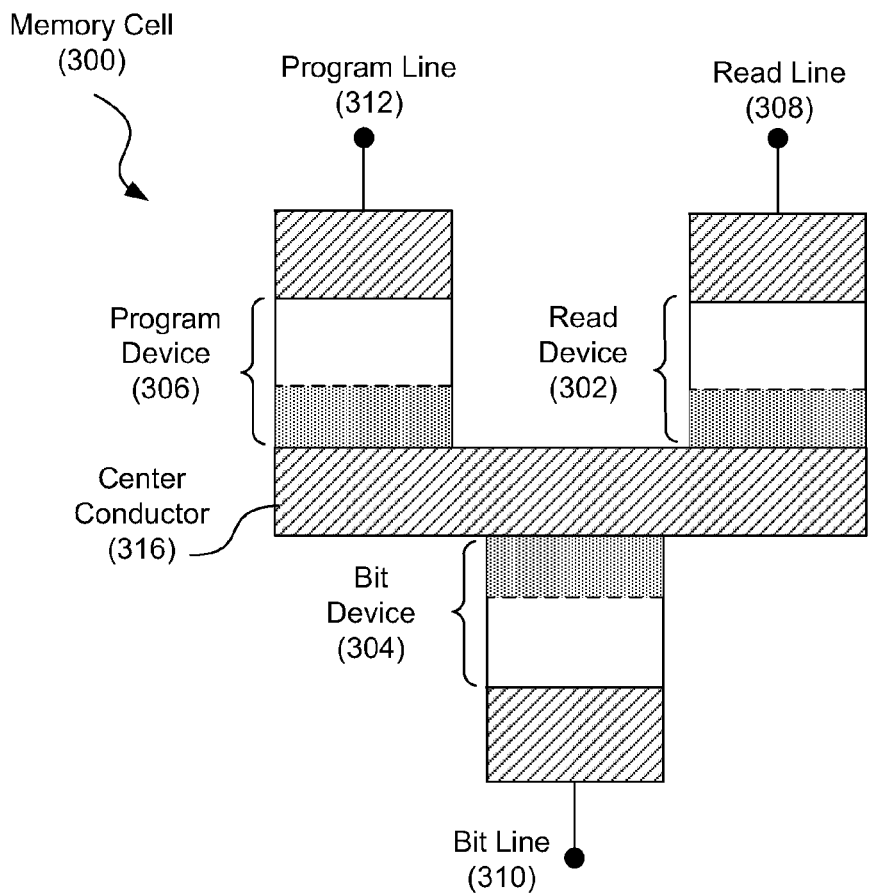
FIG. 3A is a diagram showing an illustrative three-device memory cell, according to one example of principles described herein.

FIG. 3A is a diagram showing an illustrative three-device memory cell (300). According to certain illustrative examples, the three-device memory cell (300) includes a read device (302), a bit device (304), and a program device (306). As mentioned above, all the three devices are mutually complementary. For example, the highly doped regions of the three devices (302, 304, 306) are connected together to the center conductor (316). The center conductor serves only as an intra-cell connection. It does not connect to an external line. The intrinsic region side of the three devices (302, 304, 306) are separately connected to a read line (308), a bit line (310), and a program line (312) respectively. Programming operations can be done by flipping a complementary pair of two of the three devices.

The terminal of the read device opposite of the center conductor (316) is connected to a read line (308). The read line (308) is a conductive line connected to the read device (302) of several memory cells. The read line (308) receives read voltages for the purpose of reading the state of the memory cells (300) within a memory array. More detail on read operations will be discussed below.

The terminal of the bit device (304) opposite of the center conductor (316) is connected to a bit line (310). A bit line (310) is a conductive line connected to the bit device (304) of several memory cells within a memory array. The bit line (310) can be selectively connected to a sense amplifier to read the state of the bit device (304) when a read voltage is applied to the read line (308). More detail on the read and write operations of the three-device memory cell (300) will be discussed below.

The terminal of the program device (306) opposite of the center conductor (316) is connected to a program line (312). The program line (312) is a conductive line connected to the program device (306) of multiple memory cells within a memory array. The program line (312) receives programming voltages for the purpose of writing the state of the memory cell (300). Again, more detail about the write process will be described below.

Figure 3B:
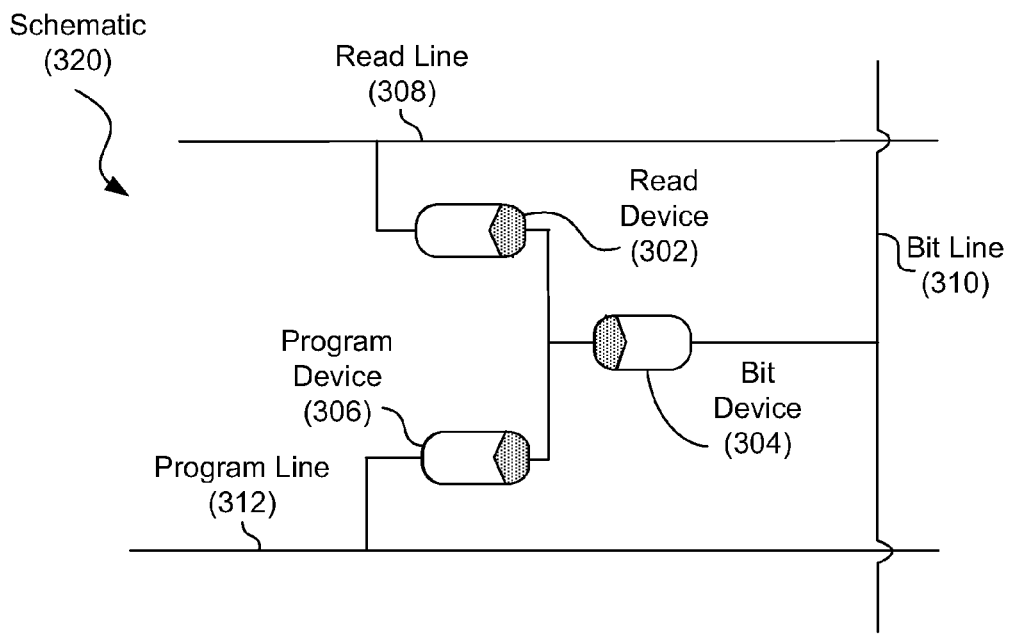
FIG. 3B is a diagram showing an illustrative schematic of the three-device memory cell, according to one example of principles described herein.

FIG. 3B is a diagram showing an illustrative schematic (320) of the three-device memory cell (300). The schematic shows that the read line (308) is parallel to the program line (312). Both the program line (312) and the read line (308) are perpendicular to the bit line (310). This formation simplifies the process of reading or writing to a group of bits at a time. Computer processing architecture is designed to operate on groups of bits rather than individual bits. These groups of bits are referred to as words. The process of reading and writing data stored in a memory array will be discussed in more detail below.

The conductive lines of a crossbar memory array are often referred to as word lines and bit lines. A word line is used to access a word while a bit line is used to access a particular bit within a word. In the example illustrated in FIG. 3B, the program line (312) acts as a word line for writing operations and the read line (308) acts as a word line for reading operations.

Figure 3C:
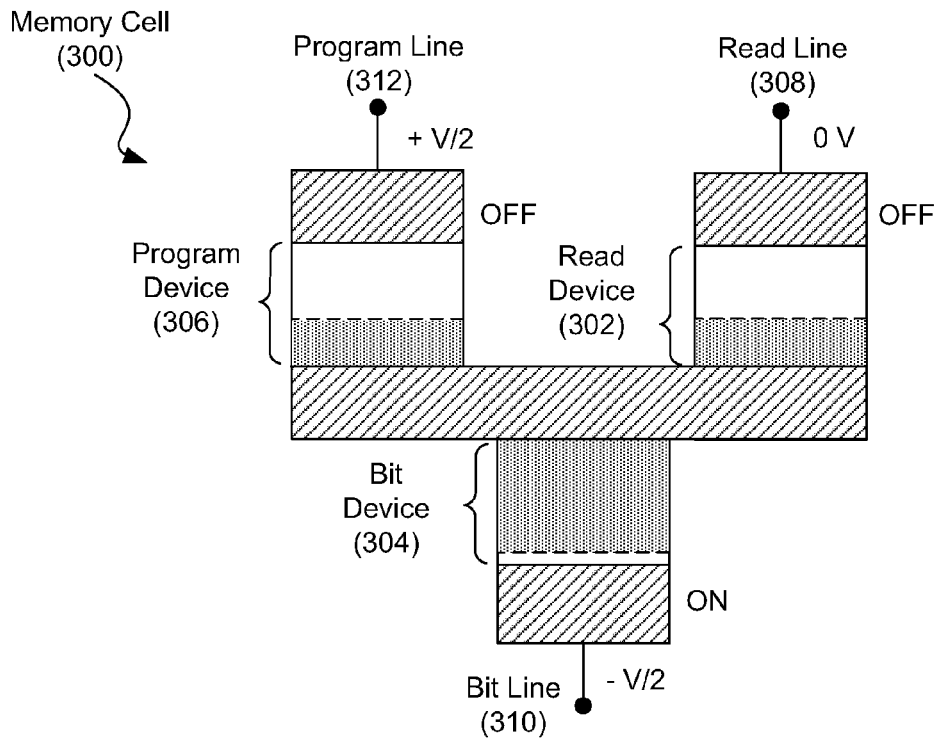
FIGS. 3C and 3D are diagrams of the three-device memory cell with programming voltages applied, according to one example of principles described herein.
Figure 3D:
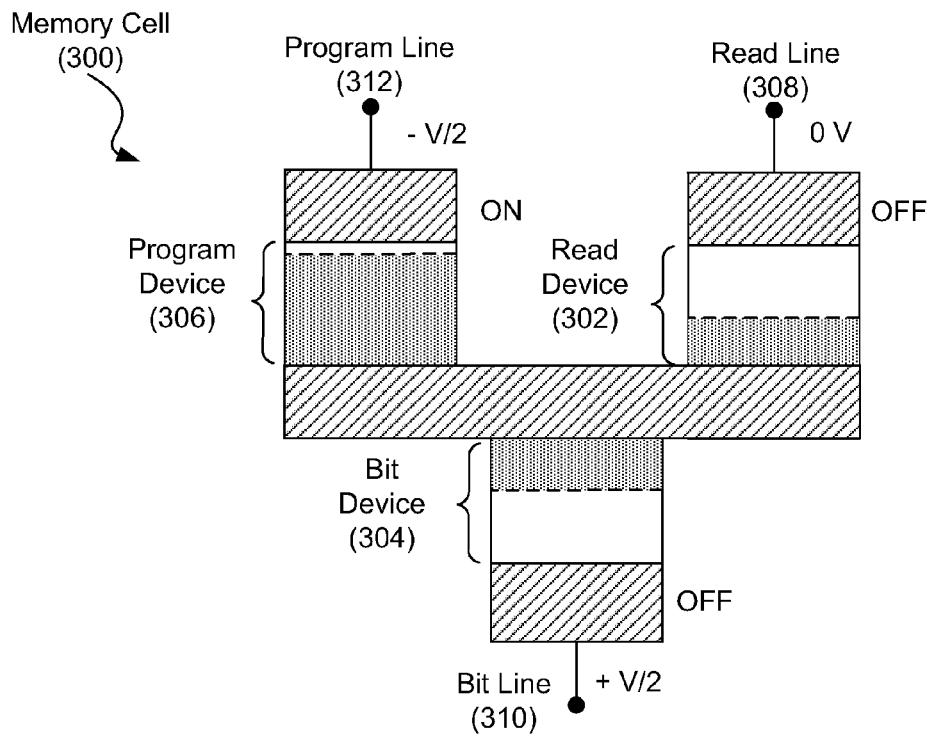

FIGS. 3C and 3D are diagrams of the three-device memory cell (300) with programming voltages applied. FIG. 3C shows the programming voltages being applied to set the bit device (304) in a low resistive (ON) state and the programming device in a high resistive (OFF) state. In one example, the ON state of the bit device (304) may represent a digital '1' and the OFF state of the bit device (304) may represent a digital '0'. FIG. 3D shows the programming voltages being applied to set the bit device (304) in an OFF state and the program device (306) in an ON state.

The programming operations of the three-device memory cell can be done by applying voltage pulses across a complementary memristive pair in the memory cell. If one device of the pair is switched from high resistive state (OFF) to low resistive state (ON) then the other device will be switched from low resistive state (ON) to high resistive state (OFF) simultaneously. Various memory cell operations including, but not limited to, initialization, reset, and write are all done by flipping complementary pairs in the three-device memory cell. More detail on cell operations will be discussed below.

According to one illustrative example, data is stored in the three device memory cell (300) in the complementary device pair between program line and bit line. Specifically when the bit device (304) is in the low resistive state (ON) and program device (306) is in the high resistive state (OFF), then the memory cell represents a '1'. Conversely, if the bit device (304) is in the high resistive state (OFF) and the program device (306) is in the low resistive state (ON), then the memory cell represents a digital '0'.

During a read operation the current flowing into the selected bit line is defined as cell current. When the memory cell (300) stores a digital '1', then there is a large cell current flowing into the bit line (310). This large cell current can trigger a sense amplifier connected to the bit line (310). Triggering the sense amplifier can inform memory controller circuitry that the bit device (304) of the memory cell (300) is in a low resistive state and thus represents a digital '1'. When the bit device (304) is in a high resistive state, then a relatively small cell current will flow into the bit line. This small cell current may be too low to trigger the sense amplifier. Thus, the memory controller circuitry can determine that the bit device (304) of the memory cell is in a high resistive state, representing a digital '0'.

In one example, the read device may be a passive device rather than a switching device. For example, the read device may behave as a high resistance probe. This will still allow reading operations to be made without requiring a destructive read.

Figure 4:
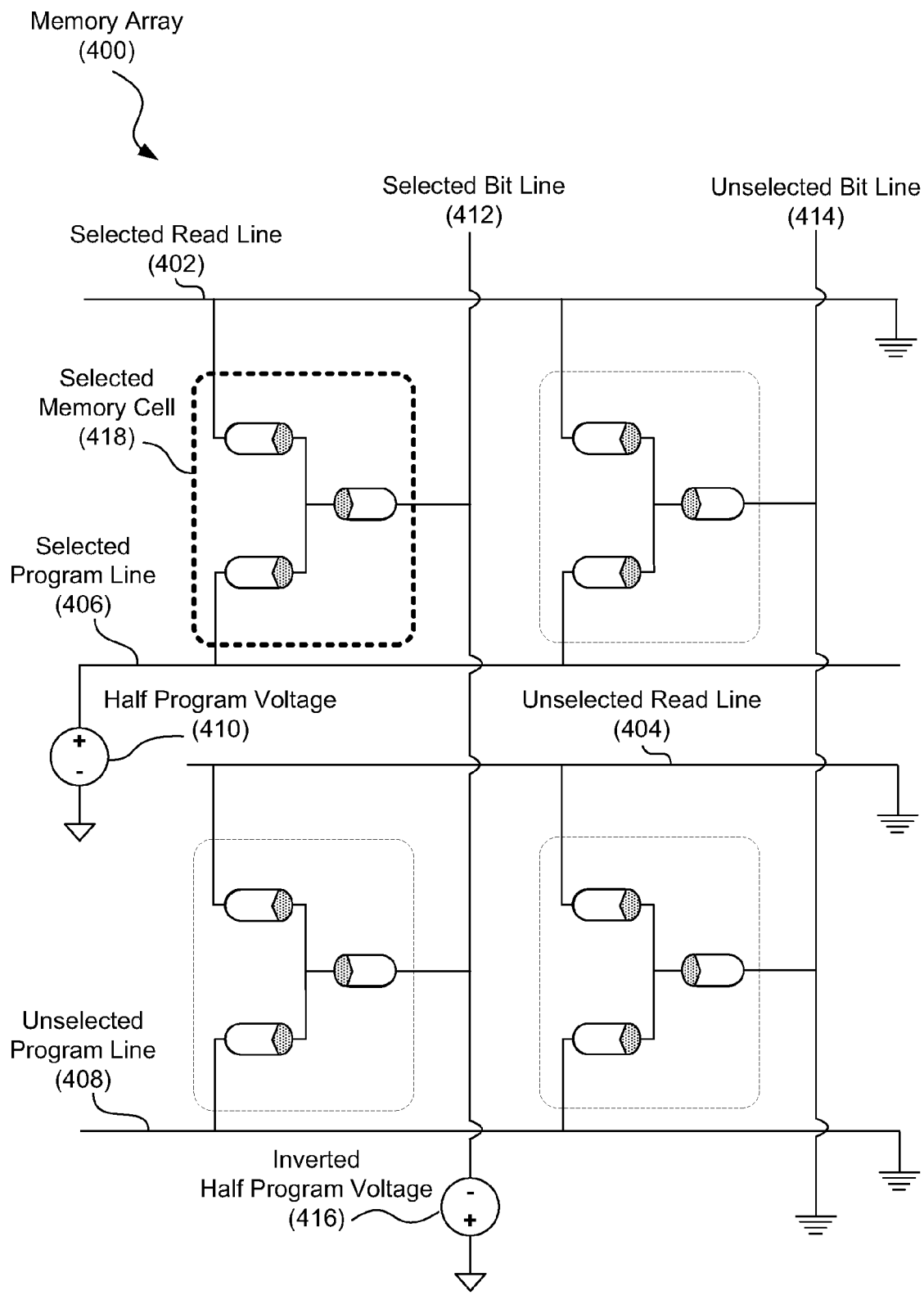
FIG. 4 is a diagram showing an illustrative schematic of a memory array having programming voltages applied to write to a selected memory cell within the memory array, according to one example of principles described herein.

FIG. 4 is a diagram showing an illustrative memory array (400) having programming voltages applied to write to selected memory cells within the memory array (400). According to certain illustrative examples, a memory array (400) includes a set of read lines intersecting a set of bit lines. Program lines are placed in parallel to the read lines. The three-device Memory cells are placed at all the intersections of the three lines. The following will describe the operation of writing the state of a selected memory cell (418) within the memory array (400). The difference between writing the state of a memory cell to store a digital '1' or a digital '0' is the polarity of the voltages applied to a memory cell. Remaining bias conditions may stay the same.

To write the state of a selected memory cell (418), a half program voltage (410) is applied to the selected program line (406) connected to the selected memory cell (418). The half program voltage (410) will be applied to all memory cells along the selected program line (406). Additionally, an inverted half program voltage (416) is applied to the selected bit line (412) connected to the selected memory cell (418). The application of the inverted half program voltage (416) will be applied to each memory cell along the selected bit line (412).

The value of the half program voltage (410, 416) is designed to be less than the threshold voltage required to change the state of the memristors of unselected memory cells. Only the selected memory cell receives the full program voltage applied across the memristors. Thus, only the state of the selected memory cells is changed.

During the application of the half program voltages (410, 416), the unselected bit lines (414), unselected program lines (408), and all read lines (402, 404) connected to unselected memory cells are connected to ground. This ensures that the unselected memory cells receive at most half of a program voltage.

In some cases, multiple memory cells along a selected program line can be written simultaneously. For example, a positive half program voltage (410) can be applied to a particular program line (406). A negative half program voltage can then be applied to multiple bit lines connected to memory cells along the selected program line (406) that are to be set to a particular state.

As mentioned above, the number of memory elements along a particular program line or bit line is limited by the amount of leakage current flowing through the unselected memory elements with the memory array. During a write operation of the selected memory cell (418), the amount of leakage current resulting from applying the program voltage (410) is dependent on the number of unselected memory cells along the selected program line (406) and the state of the unselected memory cells along the selected program line (406).

For example, with a program voltage of $V_{HS}$, the program line leakage current through an unselected memory cell storing a digital '1' can be defined by the expression $V_{HS}/R_{OFF}$, where $R_{OFF}$ is the resistance of a memristive device in the OFF state. In the case that an unselected memory cell is storing a digital '0', then the program line leakage current through that memory cell can be defined by the expression $2*V_{HS}/R_{OFF}$. The worst case scenario is if each unselected memory cell along the selected program line is storing a digital '0'. The number of memory elements placed along a particular program line is often limited by the worst case scenario. In the case that there are 511 unselected memory cells along a program line, then the worst case program line leakage current can be defined by the expression $2*V_{HS}*511/R_{OFF}$. In the case that $V_{HS}$ is 1 volt and $R_{OFF}$ is 1 mega-ohm, then the worst case program line leakage current would be about 1 milliamp.

The same leakage calculation also applies to the unselected memory cells along a selected bit line but the worst case is when the unselected cells on a selected bit line are storing a digital '1'. The programming current of the single selected memory cell is about 200 micro-amperes. Therefore, by accepting a worst case programming leakage current of approximately two milliamps, a 512×512 block of memory can be constructed. This limit on the array size can be increased by using devices with a higher $R_{OFF}$ resistance or by improving the $R_{OFF}/R_{ON}$ ratio, where $R_{ON}$ is the resistance of a device in the ON state.

Figure 5:
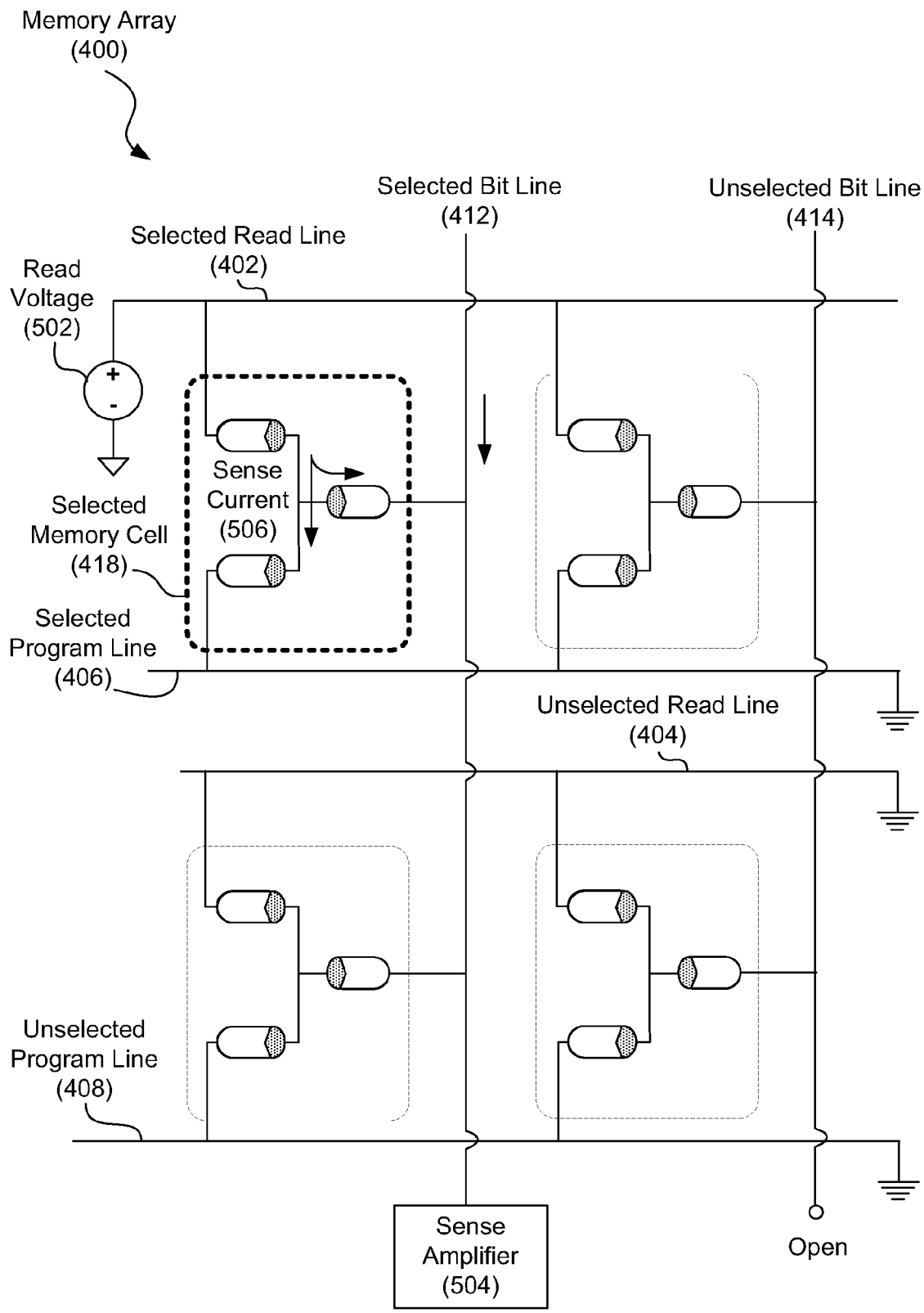
FIG. 5 is a diagram showing an illustrative schematic of a memory array having programming voltages applied to read the selected memory cell within the memory array, according to one example of principles described herein.

FIG. 5 is a diagram showing an illustrative memory array having programming voltages applied to read the selected memory cells within the memory array. According to certain illustrative examples, the state of a memory cell is read by applying a read voltage (502) to the selected read line (402) connected to the selected memory cell (418), and connecting a sense amplifier (504) to the selected bit line (412). The following will describe the read operation in detail.

With the application of the read voltage (502), an electric current will flow through the read device. This current will be referred to as the sense current (506). The sense current will then flow partially through the bit device to the sense amplifier (504) and partial through the program device to the ground. The state of the bit device and the state of the program device will affect the portion of the sense current (506) flowing into the selected bit line (412). As defined previously the current flowing into the selected bit line is referred to as the cell current. The cell current then flows along the bit line to the sense amplifier (504). Based on the received cell current, the sense amplifier will be able to determine the logic state of the selected memory cell (418).

For example, if the memory cell is storing a digital '0', then the bit device is in a high resistive state and the program device will be in a low resistive state. Because the selected program line (406) is connected to ground, the majority of the sense current will flow through the program device and to ground. This will cause very little current to flow along the selected bit line (412) to the sense amplifier (504).

If the selected memory cell is storing a digital '1', then the bit device of the selected memory cell (418) is in a low resistive state and the program device of the selected memory cell (418) will be in a high resistive state. Therefore, the majority of the sense current (506) will flow through the selected bit line (412) and to the sense amplifier (504). Thus, based on the amount of current received by the sense amplifier (504), the logic state of the selected memory cell can be determined.

As mentioned above, the leakage current which takes sneak paths through the memory array adversely affects the read process. With the application of the read voltage (502) to the selected read line (402), each read device of unselected memory cells along the selected read line will have the read voltage applied. However, the unselected bit lines (414) will be left open at a decoder at the end of the bit line. A decoder is a digital circuit typically used by memory addressing circuitry.

With the read voltage applied to unselected memory elements along a read line, sneak paths will flow through those unselected memory elements and eventually to the selected bit line (412). Thus, the sneak path currents will combine with the cell current from the selected memory cell (418). The leakage current of a single sneak path is smaller than the cell current. However, there are often multiple sneak paths. For example, with 511 unselected memory cells along the selected read line (402), there could be 511 sneak paths. The amount of electric current from each of these sneak paths is dependent upon the data stored in the array. These sneak paths can overwhelm the cell current. Thus, the sense amplifier will not function properly. To prevent this from happening, the unselected read lines and the unselected program lines are connected to ground. This will ground the sneak path currents, leaving a clean cell current for the sense amplifier. The current received by the sense am[plifier (504) will then be a function of only the cell current.

The difference in cell current between a memory cell storing a digital '1' and a memory cell storing a digital '0' is equal to the $R_{OFF}/R_{ON}$ ratio of the devices in the memory cell. The $R_{OFF}/R_{ON}$ ratio typically ranges from 100 to 1000. This allows the sense amplifier to distinguish between the two logic states. For high values of $R_{OFF}$, such as 10 mega-ohms or more, the cell current from the memory cell representing a digital '1' is reduced by the read device resistance $R_{OFF}$. However, the cell current can be integrated at the input of sense amplifier. In this case, the read speed will be slower by the integration time and there will be a tradeoff between array size and read access speed. Higher $R_{OFF}$ resistance allows for a larger array size but reduces the read access speed.

FIG. 6 is a table (600) showing illustrative memory cell operations. The table (600) shows the voltages applied to selected lines as well as the state of each of the three devices within the selected memory cell as a result of those voltages. According to certain illustrative examples, when a three-device memory cell is first manufactured, each device within the memory cell is in a virgin state (602). This state is typically the OFF state with a very high resistance. The operations which may then be applied to the memory cell are initialization (604), reset (606), program '1' (608), program '0' (610), and read (612).

To initialize (604) the selected memory cell, a negative voltage is applied to the bit line and a positive voltage is applied to the read line while grounding the program line. This sets the bit device to an ON state and the read device to an OFF state. This OFF state is no longer the virgin OFF state. During the initialization operation, all of the unselected program lines, bit lines, and read lines are grounded.

The reset (606) operation gets a selected memory cell ready for programming. This operation is performed by applying a negative voltage to the program line and a positive voltage to the bit line while grounding the read line. This sets the program device to an ON state and the bit device to an OFF state. During the reset operation, all of the unselected program lines, bit lines, and read lines are grounded.

To program (608) a selected memory cell to store a digital '1', a positive voltage is applied to the program line and a negative voltage is applied to the bit line while grounding the read line. This sets the program device to an OFF state and the bit device to an ON state. To program (610) a selected memory cell to store a digital '0', a negative voltage is applied to the program line and a positive voltage is applied to the bit line while the read line is grounded. This puts the program device in an ON state and the bit device in an OFF state. In general, the read device remains in the OFF state during normal programming operations. To ensure successful programming, the read device should be in a high resistance or OFF state. During the program operation, all of the unselected program lines, bit lines, and read lines are grounded.

To read (612) the state of a selected memory cell, the program line is grounded and the bit line is connected to a sense amplifier. A read voltage is then applied to the read line. This read voltage is relatively small compared to the programming voltages. Thus, the state of the devices within the memory cell will not change with the application of the read voltage. The value of the read voltage can be altered to find a balance between read access time and power consumption. During the read operation, all of the unselected bit lines are set to float and all of the unselected program lines and read lines are grounded.

Figure 7:
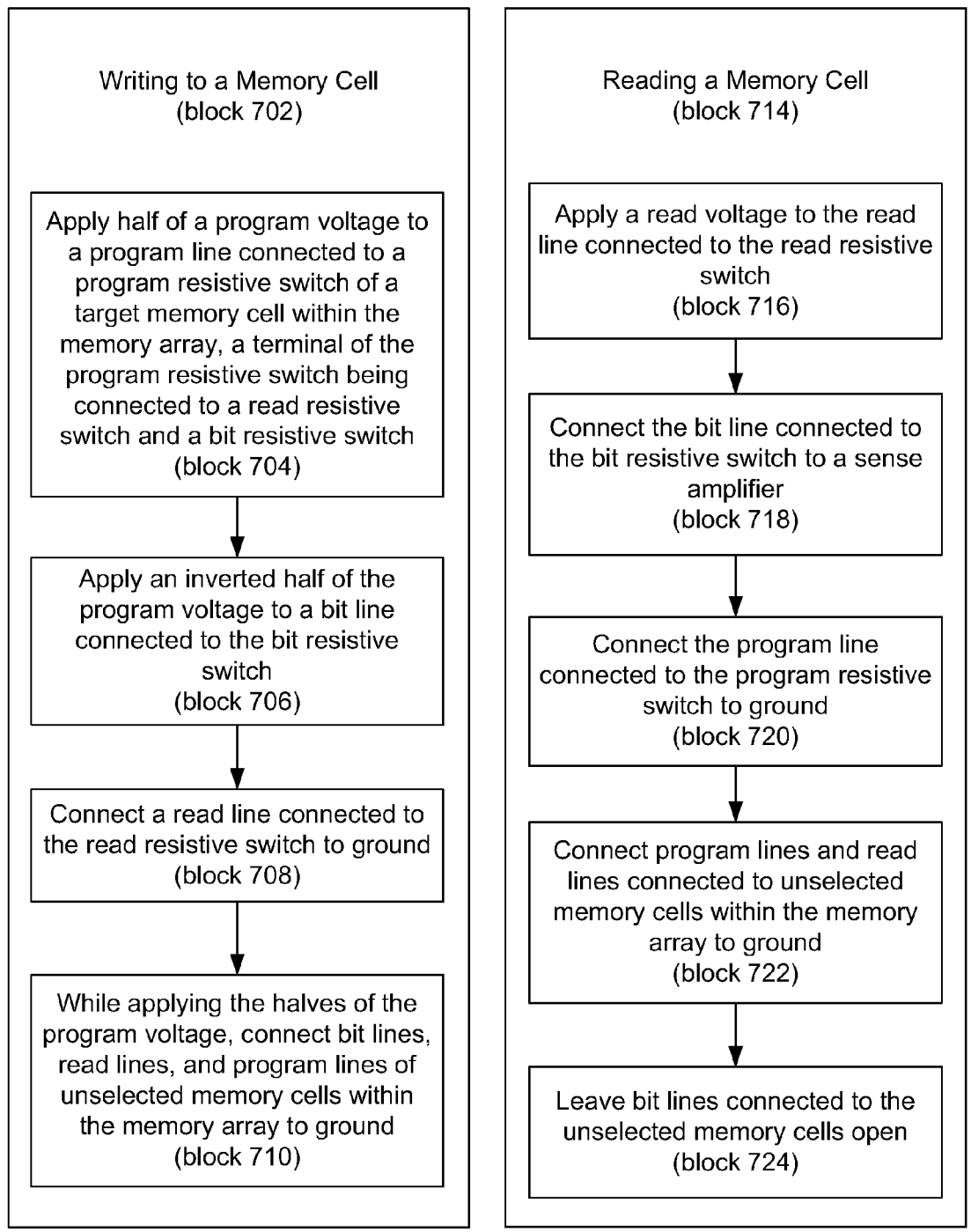
FIG. 7 is a flowchart showing an illustrative method for storing and reading back data within a three-device memory cell, according to one example of principles described herein.

FIG. 7 is a flowchart showing an illustrative method (700) for storing data within a three-device memory cell. According to certain illustrative examples, the process of writing (block 702) to a memory cell includes applying (block 704) half of a program voltage to a program line connected to a program resistive device of a target memory cell within the memory array, a terminal of the program resistive device being connected to a read resistive device and a bit resistive device, applying (block 706) an inverted half of the program voltage to a bit line connected to the bit resistive device, connecting (block 708) a read line connected to the read resistive device to ground, and while applying the halves of the program voltage, connecting (block 710) bit lines, read lines, and program lines of unselected memory cells within the memory array to ground.

According to certain illustrative examples, reading (block 714) the state of a memory cell includes, applying (block 716) a read voltage to the read line connected to the read resistive device, connecting (block 718) the bit line connected to the bit resistive device to a sense amplifier, connecting (block 720) the program line connected to the program resistive device to ground, connecting (block 722) program lines and read lines connected to unselected memory cells within the memory array to ground, and leaving (block 724) bit lines connected to the unselected memory cells open.

In conclusion, the three-device memory cell reduces leakage currents during the write operation. This allows more memory cells to be placed within a particular block of memory. Additionally, the three-device memory cell does not have a destructive read. Therefore, an additional write back operation is not needed after each read operation. This increases the read access speed at which the memory array is able to operate. It also reduces the power consumed during reading operation The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A three-device non-volatile memory cell comprising:
a first resistive device;
a second resistive device; and
a third resistive device;
in which the first resistive device, the second resistive device, and the third resistive device each comprise a doped region;
in which the doped regions of the first resistive device, the second resistive device, and the third resistive device are coupled to a common conductor, and
in which one of the first resistive device, the second resistive device, and the third resistive device is functionally mutually complimentary with one of the other of the first resistive device, the second resistive device, or the third resistive device at any time after initialization of the memory cell.

2. The memory cell of claim 1, in which a state of said memory cell is set by applying half of a program voltage to said second resistive device and an inverted half of said program voltage to said first resistive device.

3. The memory cell of claim 2, in which during application of said halves of said program voltage, said third resistive device is connected to a ground.

4. The memory cell of claim 1, in which said first resistive device is selectively connected to a sense amplifier.

5. The memory cell of claim 4, in which data stored in said memory cell is read by applying a read voltage to said third resistive device and measuring electric current with said sense amplifier.

6. The memory cell of claim 5, in which during application of said read voltage, said second resistive device is connected to a ground.

7. The memory cell of claim 1, in which said resistive devices are memristive devices.

8. The memory cell of claim 1, in which said third resistive device is a passive high resistive probe.

9. The memory cell of claim 1, in which the third resistive device is connected to one of the first resistive device and second resistive device in a functionally mutual complementary manner at any given time after initialization.

10. The memory cell of claim 1, in which initialization is performed by applying a negative voltage to the first resistive device and applying a positive voltage to the third resistive device.

11. A memory array comprising:
a set of read lines intersecting a set of bit lines;
a set of program lines intersecting said set of bit lines; and
memory cells disposed at intersections between said intersecting set of bit lines, each of said memory cells comprising:
a program resistive device connected to one of said program lines;
a read resistive device connected to one of said read lines; and
a bit resistive device connected to one of said bit lines;
in which the program resistive device, read resistive device, and bit resistive device are coupled to a common conductor.

12. The memory array of claim 11, in which a state of a target memory cell within said memory array is set by applying half of a program voltage to a program line connected to said program resistive device and an inverted half of said program voltage to a bit line connected to said bit resistive device of said target memory cell.

13. The memory array of claim 11, in which a state of a target memory cell within said memory array is read by applying a read voltage to a read line connected to said target memory cell and connect a bit line connected to said target memory cell to a sense amplifier.

14. The memory array of claim 13, in which during application of said read voltage, a program line connected to said target memory cell is connected to ground.

15. The memory array of claim 11, in which said resistive devices are memristive devices.

16. The memory array of claim 11, in which said read resistive device comprises a passive high resistance device.

17. The memory array of claim 11, in which the bit resistive device is connected to one of the program resistive device and read resistive device in a functionally mutual complementary manner at any given time after initialization.

18. The memory array of claim 11, in which initialization is performed by applying a negative voltage to the bit resistive device and applying a positive voltage to the read resistive device.

19. A method for storing data in a memory array comprising a number of memory cells, the method comprising:
applying half of a program voltage to a program line connected to a program resistive device of a target memory cell within said memory array, a terminal of said program resistive device being connected to a read resistive device and a bit resistive device;
applying an inverted half of said program voltage to a bit line connected to said bit resistive device; and
connecting a read line connected to said read resistive device to ground.

* * * * *